United States Patent
Bridgewater, Jr.

(10) Patent No.: US 6,222,388 B1
(45) Date of Patent: Apr. 24, 2001

(54) LOW VOLTAGE DIFFERENTIAL DRIVER WITH MULTIPLE DRIVE STRENGTHS

(75) Inventor: Walter Francis Bridgewater, Jr., San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/270,947

(22) Filed: Mar. 17, 1999

Related U.S. Application Data

(62) Division of application No. 08/944,336, filed on Oct. 6, 1997.
(60) Provisional application No. 60/044,620, filed on Apr. 18, 1997.

(51) Int. Cl.[7] .................... H03K 19/094; H03K 19/0175
(52) U.S. Cl. ................. 326/86; 326/57; 327/108
(58) Field of Search .................. 326/83, 86, 57, 326/58; 327/108

(56) References Cited

U.S. PATENT DOCUMENTS

| | | | |
|---|---|---|---|
| 4,567,384 | 1/1986 | Stuhlmiller | 307/442 |
| 5,325,355 | 6/1994 | Oprescu et al. | 370/24 |
| 5,374,861 | 12/1994 | Kubista | 326/30 |
| 5,592,510 | 1/1997 | Van Brunt et al. | 375/220 |
| 5,635,853 | 6/1997 | Kikinis | 326/30 |
| 5,694,060 | 12/1997 | Brunt et al. | 326/86 |
| 5,767,699 | 6/1998 | Bosnyak et al. | 326/86 |
| 5,880,599 | 3/1999 | Bruno | 326/56 |
| 5,977,796 | 11/1999 | Gabara | 326/86 |
| 6,008,674 | * 12/1999 | Wada et al. | 327/89 |

* cited by examiner

Primary Examiner—Michael Tokar
Assistant Examiner—Daniel D. Chang
(74) Attorney, Agent, or Firm—Martine Penilla and Kim, LLP

(57) ABSTRACT

The first pulse problem for a low-voltage differential SCSI bus driver is remedied by supplying greater power for a first pulse of a bus line after a steady state condition. Activity detection circuitry detects when a signal has remained in a steady state for a number of bus cycles and enables an additional power boosting differential driver to deliver an appropriate amount of power for a limited amount of time in order to produce a quality first pulse while minimizing power output. The extra power needed to remedy the quality of the first pulse is only supplied for the duration of the first pulse so that the output driver strength is minimized and the total power over time that an integrated circuit must dissipate is reduced. In another embodiment, instead of greater than normal power being delivered for a first pulse, the output driver is decreased in its output drive strength while an output remains in a particular state. When the output does finally switch states, it switches at normal strength; the net effect is an increased drive strength from the steady state to the new state. Step down control circuitry is used to determine after a specified number of clock pulses how much power should be stepped down and in how many increments.

10 Claims, 8 Drawing Sheets

LOW VOLTAGE DIFFERENTIAL DRIVER WITH MULTIPLE DRIVE STRENGTHS

This is a Divisional application of copending prior application Ser. No. 08/944,336 filed on Oct. 6, 1997, the disclosure of which is incorporated herein by reference.

This application claims priority of provisional application No. 60/044,620, filed Apr. 18, 1997, of the same title and inventor, and is related to U.S. patent application Ser. No. 08/944,903, filed on the same date herewith, entitled "Low Voltage Differential Dual Receiver", which is hereby incorporated by reference.

FIELD OF THE INVENTION

The present invention relates generally to data communications within a computer system. More specifically, the present invention relates to a differential driver of bus line.

BACKGROUND OF THE INVENTION

Within a computer system, it is often desirable to connect a variety of peripherals to the system bus of the computer itself for communication with the central processing unit and other devices connected to the computer. A variety of bus types may be used, and for any bus it is important to have bus drivers and bus receivers that allow devices to communicate quickly, efficiently and accurately.

FIG. 1 illustrates an embodiment of a computer system 10. Computer system 10 includes a computer 12, a disk drive 14, a tape drive 16, and any number of other peripherals 18 such as card reader units, voice input/output, displays, video input/output, scanners, etc. The computer and peripherals in this example are connected via a Small Computer System Interface (SCSI) bus 20, although a wide variety of other buses may also be used.

Any number of computers or hosts may be present in computer system 10 and be connected to SCSI bus 20. Each computer may also contain a variety of hardware and software. By way of example, computer 12 includes a monitor 30, a motherboard 32, a wide variety of processing hardware and software 34 and an SCSI host adapter card (or interface card) 36. Host adapter card 36 provides an interface between the microcomputer bus of computer 12 located on motherboard 32 and SCSI bus 20.

SCSI is a universal parallel interface standard for connecting disks and other high performance peripherals to microcomputers. However, it should be appreciated that computer system 10 is an example of a system, and other interface standards having characteristics similar to SCSI may also be used in such a computer system. By way of example, an Intelligent Peripheral Interface (IPI) standard is one such other standard.

In one embodiment, SCSI bus 20 is an 8-bit parallel flat cable interface (18 total signals) with hand shakes and protocols for handling multiple hosts and multiple peripherals. It has both a synchronous and an asynchronous mode, and has defined software protocols. In the embodiment shown, the SCSI bus uses differential drivers, although SCSI is also available with single wire drivers. SCSI interface cards (such as card 36) plug into most microcomputer buses including VME and Multibus I and II. In another embodiment, SCSI bus 20 is a 16-bit parallel cable interface (27 total signals). In other embodiments motherboard 32 has SCSI adapter card 36 incorporated into the motherboard itself, and a separate, plug-in adapter card is not needed. SCSI bus 20 is a multi-drop bus typically produced as a flat cable that connects from a computer 12 to any number of peripherals. In this example, disk drive 14, tape drive 16, and other peripherals 18 connect to SCSI bus 20 by tapping into the bus. In other examples, it is possible for any number of peripherals to be inside computer 12 in which case SCSI bus 20 may also be present inside computer 12 also.

Disk drive 14 includes the physical disk drive unit 40 and SCSI controller card 42 and other internal cables and device level interfaces (not shown) for enabling the unit to communicate with computer 12. After connecting to disk drive 14, SCSI bus 20 continues on to connect to tape drive 16. Tape drive 16 includes the physical tape drive 50, SCSI controller card 52, and other internal cables and interfaces (not shown) for communicating with computer 12.

SCSI bus 20 also connects to any number of other peripherals 18. In alternative embodiments of the invention, any of the peripherals shown may eliminate the SCSI controller card by using an "embedded SCSI" architecture in which the SCSI bus becomes also the device level interface. In these peripherals, a cable such as SCSI bus 20 may be connected directly from motherboard 32 of a computer to a peripheral without the need for connecting to an internal controller card.

FIG. 2 shows in greater detail 50 SCSI bus 20 and connections to it from computer 12 and a peripheral 18. SCSI bus 20 may come in a variety of standards. Illustrated here by way of example, is a 16-bit SCSI bus with a variety of its control signals shown. Shown are the signals data[0] 52 through data[15] 54, parity 56, ACK (acknowledge) 58, REQ (request) 60, and a variety of other control signals 62.

This example illustrates how one value from computer 12 may be transferred via SCSI bus 20 to peripheral 18. It should be appreciated that any number of data or control signals may be transferred back and forth on the SCSI bus. For example, computer 12 has a value 70 that passes through a driver 72 and over an electrical connection 74 to the bus line data[15]. At the peripheral end, the signal on bus line data[15] is passed by way of an electrical connection 76 to a receiver 78 whereby value 70 is received in peripheral 18. Techniques by which a value may be transmitted by a driver over an SCSI bus to be received by a receiver in another electronic device are well known to those of skill in the art.

FIG. 3 shows in greater detail 80 a prior art technique by which value 70 is transmitted from computer 12 to peripheral 18. FIG. 3 illustrates a proposed SCSI standard known as the ULTRA 2 Specification being proposed by the SPI-2 working group. As in FIG. 2, FIG. 3 shows a value 70 being transmitted by a driver 72 from computer 12 to a receiver 78 in peripheral 18. Because SCSI bus 20 uses a voltage differential technique of transferring information, value 70 is transmitted using a signal line 82 from driver 72 and also using its complement, signal/ 84. In other words, signal lines 82 and 84 are used to transmit information for bus line data[15] 54. In a similar fashion, information for other bus lines is transmitted using two signal lines.

The SCSI bus also uses a bias voltage in the termination at each end of the SCSI bus. The termination bias voltage is used during the arbitration phase of SCSI protocol in order to help determine which devices are asserting which bits on the bus. Without a termination bias voltage, it would be difficult to determine which device is asserting a data bit because bits not being asserted would be floating. To achieve the termination bias voltage, computer 12 includes a voltage source V(A) 86 (for example, 1.5 volts) and a voltage source V(B) 88 (for example, 1.0 volt) which are connected in series using resistors 90 (for example, 270 ohms), resistor 92 (for example, 138 ohms), and resistor 94 (for example, 270 ohms). This termination bias voltage circuit is connected to signal lines 82 and 84 as shown. Thus, point 91 is typically at 1.3 volts due to the termination bias voltage, and point 93 is typically at 1.2 volts due to the termination bias voltage. The termination bias voltage also results in an approximate termination resistance of 110 ohms.

In a similar fashion, peripheral 18 also includes a termination bias voltage. As in computer 12, resistors 95, 96, and 97 connect in series voltages V(A) and V(B). These voltages and resistances may have similar values as for computer 12 and are connected to signal lines 82 and 84 as shown. Also shown in FIG. 3 are multiple bus taps 98 symbolizing the variety of other devices, computers, and peripherals that may also tap onto SCSI bus 50.

One technique for transmitting data over a SCSI bus uses a low-voltage swing differential (LVD) and a low offset voltage, high speed, differential input receiver. The driver for this type of SCSI bus uses an asymmetrical output, where one direction has more drive strength than the other. The reason for this asymmetrical output is because of the termination bias voltage as shown in FIG. 3. One technique for eliminating the termination bias voltage and transmitting data at high speeds using symmetrical drivers and receivers is discussed in U.S. Pat. application Ser. No. 08/944,903 referenced above.

However, the use of an interface standard such as SCSI can lead to what is termed the "first pulse problem". The first pulse problem is especially noticeable with the data signals and the parity, ACK, and REQ signals of a SCSI bus. The "first pulse problem" can be described as too much attenuation of a signal for its first pulse after a steady state. If a driver maintains a value for several clock cycles, or one of the clock signals on the bus stops for a few cycles (and maintains a constant value), the first pulse after this constant value (when output driver changes state) will not be of good quality. In other words, when the signal finally changes after being in one state for a number of clock pulses (often as few as four pulses), the very next pulse is of poor quality. First pulses of poor quality lead to inaccurate transmission of data and/or control signals.

The first pulse problem is caused by the frequency roll-off or high frequency attenuation characteristics of cables. This attenuation is combined with a last signal level being driven all the way to its maximum limits while the cable is being driven in a constant state. If a cable is driven to a constant state for a long time, it goes to its maximum possible voltage level, then when a high frequency signal starts to run again, it cannot drive the maximum voltage level in the other direction. Thus, the amount of over drive in the other direction is small. A constant high frequency driven in a cable does not experience the first pulse problem in such a dramatic fashion because the signal never goes to its maximum voltage level in either direction.

Various other technologies encode transmission of data so that there are never long periods of time where the signal is not changing. Thus, because signals are constantly changing for these technologies, the first pulse problem is not as prevalent. This encoding takes place primarily in serial data systems. However, other interface standards such as SCSI use parallel data transmission. In a parallel data transmission the encoding of data can be very problematic and is almost never performed. Thus, for interface standards using parallel data transmission (such as SCSI), the first pulse problem exists.

FIG. 4 illustrates a series of pulses 100 for a particular signal coming from a driver of a low-voltage differential (LVD) SCSI bus (for example). The SCSI bus uses a low-voltage swing differential for communication which results in a particular value to be transmitted being represented by the complementary pulses shown. Signal 101 and signal/ 102 may originate from a driver such as driver 72 of FIG. 3. By convention, signal 101 represents possible pulses occurring on signal line 82, while signal/ 102 represents the complement of these pulses as might be occurring on signal line 84.

In a steady state, signal and signal/ have a difference of about 500 mV 103. This voltage difference for a pair of signals (representing a value to be transmitted over a differential bus) allows the receiver to accurately determine the value to be transmitted. If signal and signal/ do not have a great enough voltage differential, then the receiver is unable to determine what value is being transmitted from the driver. Lack of a great enough voltage differential can occur due to the first pulse problem.

For example, as shown in FIG. 4, signal and signal/ have remained in a constant state until a first pulse 104 occurs. As can be seen from the pulses, at first pulse 104 signal 101 is only able to obtain a voltage level 105 which is far lower than the voltage level that signal/ 102 had maintained during its steady state. Likewise, signal/ 102 is only able to reach a voltage level 106 which is far short of the voltage level maintained by signal 101 in its static state. In this example, peaks 105 and 106 at first pulse 104 are only separated by about 100 mV 107. This minimal voltage separation of 100 mV is to be contrasted with the much larger voltage differential of 500 mV before the first pulse occurred. A differential of only 100 mV is not enough to allow a receiver to correctly interpret a signal and causes problems.

After the first pulse, subsequent pulses 108, 110, 112, etc., are able to achieve a much greater voltage differential. As can be seen in FIG. 4, when switching occurs after first pulse 104, signal and signal/ are separated by a voltage differential of about 300 mV in their steady states. For example, at third pulse 110, signal 101 is at a higher voltage level than signal/ 102 and the difference between these voltage levels is about 300 mV. A voltage differential of about 300 mV is enough of a difference for a receiver to determine accurately the value being transmitted by a driver. However, a minimal 100 mV differential 107 separating signal from signal/ at first pulse 104 is not enough of a voltage difference for a receiver to accurately determine the value being transmitted. Thus, a first pulse after a constant state on a differential bus is often of unacceptable quality.

A voltage differential driver and receiver may be implemented in a wide variety of fashions. By way of example, FIG. 4 has illustrated one such embodiment of an LVD SCSI bus line in which a difference of 500 mV occurs in a steady state, a difference of 300 mV is adequate for signal transmission, and a voltage difference of 100 mV is inadequate for transmissions. Of course, other voltage levels and differentials may be appropriate with other types of differential drivers and receivers.

Therefore, a technique and apparatus is desired that would remedy this first pulse problem for differential drivers. Such an apparatus would also minimize output driver strength to reduce the amount of power that an integrated circuit must dissipate.

SUMMARY OF THE INVENTION

To achieve the foregoing, and in accordance with the purpose of the present invention, a low-voltage differential driver for a bus is disclosed that remedies the first pulse problem. An improved multi-strength driver is capable of supplying extra power when needed. A relative increase of fifty-percent power for a first pulse over a power level previous to the first pulse is found to work well for eliminating the first pulse problem.

The present invention relates to an apparatus and methods for producing a quality first pulse on a bus line after a period of steady state on that bus line. In a preferred embodiment of the invention, activity detection circuitry detects when a steady state has been maintained for a specified number of clock cycles, and produces a boost enabling signal when the bus line next changes state in order to activate a boost differential driver for producing more power. Advantageously, the boost differential driver may only provide a power boost for the first pulse, so that extra power need not be dissipated by the driver for continuous pulses. Power may be increased in one step as noise immunity is higher for power increases.

In an alternative embodiment, power is reduced in increments while a bus line remains in a steady state. Detect logic determines when portions of current sources should be turned off, thus reducing power in increments to the differential driver. Thus, power is reduced to the bus line while it remains in a steady state and power is conserved. When the bus line finally switches, logic turns on all portions of the current source so that the differential driver receives normal power for the first and subsequent pulses. Thus, the net effect is that the first pulse after a steady state receives greater power than before the first pulse. Power is conserved because reduction in power occurs during a steady state and no more than normal power is used for a first pulse. Also, reduction of power in steps helps to prevent noise problems associated with dramatic reductions in power.

In one particular embodiment, the use of symmetrical drivers allows the driver current to be increased or decreased more easily; an increase of drive current supplies more power to the signal, and similarly, a decrease of drive current reduces power to the signal.

Furthermore, the present invention is also applicable to a variety of other situations where a variable strength driver may be needed, and not necessarily to solve the first pulse problem. For example, concerning cable equalization, a given cable has a known attenuation for length and frequency. Certain data transmission standards require the use of cable equalization, where some kind of an inductor-capacitor network is added in series with the cable. The equalization network makes the cable attenuation the same for all frequencies. An adjustable-strength driver of the present invention may be used instead of such an inductor-capacitor network to achieve cable equalization. In a second example, concerning DC component compensation, a DC component is created in a signal when there are more "1"s than "0"s, or more "0"s than "1"s. The DC component makes it look like the whole signal has shifted up or down. An adjustable-strength driver of the present invention may be used to compensate for the DC component in the signal, where a strength adjustment may not need to be done on every first pulse occurrence.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention solves the first pulse problem for a bus using a multi-strength driver. In particular, the present invention is applicable to the data lines and the parity, ACK and REQ signals of an low-voltage differential (LVD) SCSI bus. The present invention uses a variety of techniques to not only detect when a signal has remained in a steady state for a number of bus cycles, but also to deliver an appropriate amount of power for a limited amount of time in order to produce a quality first pulse while minimizing power output.

Figure 1:
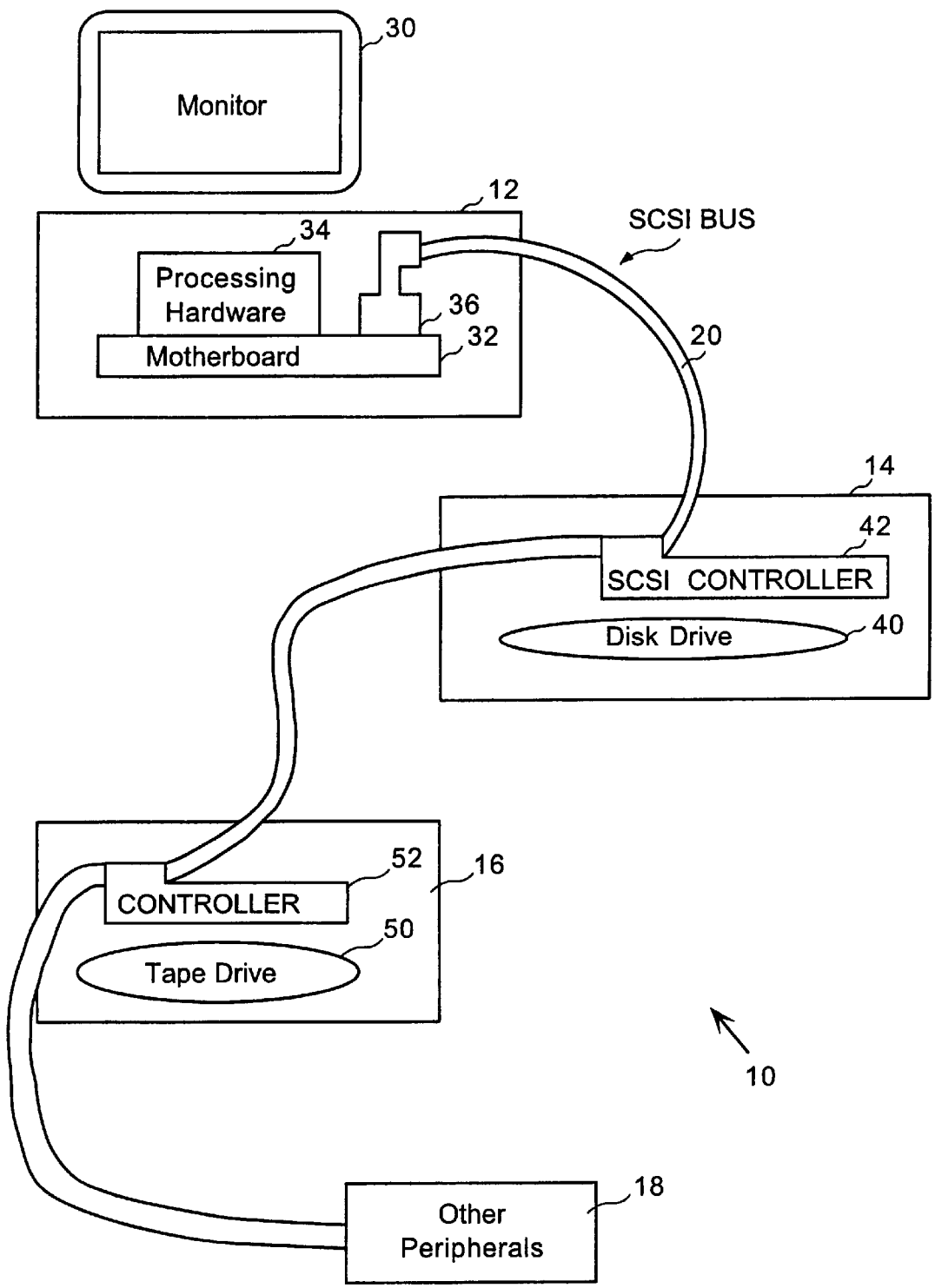
FIG. 1 illustrates a computer system in which an embodiment of the present invention may be used.
Figure 2:
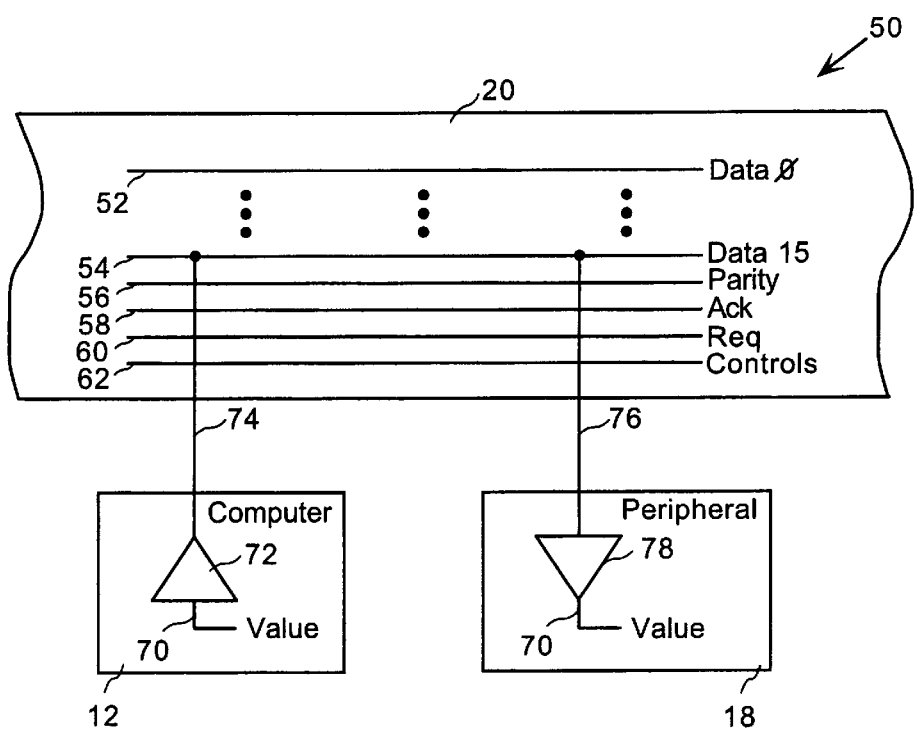
FIG. 2 illustrates in greater detail the SCSI bus from FIG. 1 and its connections to a computer and a peripheral.
Figure 3:
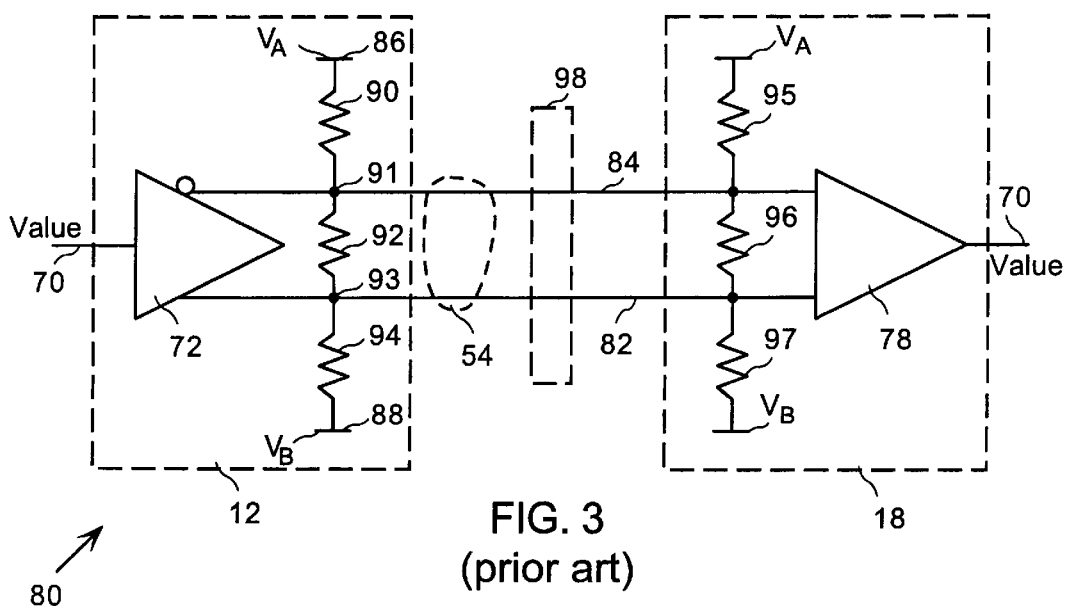
FIG. 3 illustrates in greater detail a data line from the SCSI bus of FIG. 2 and an associated driver and receiver.
Figure 4:
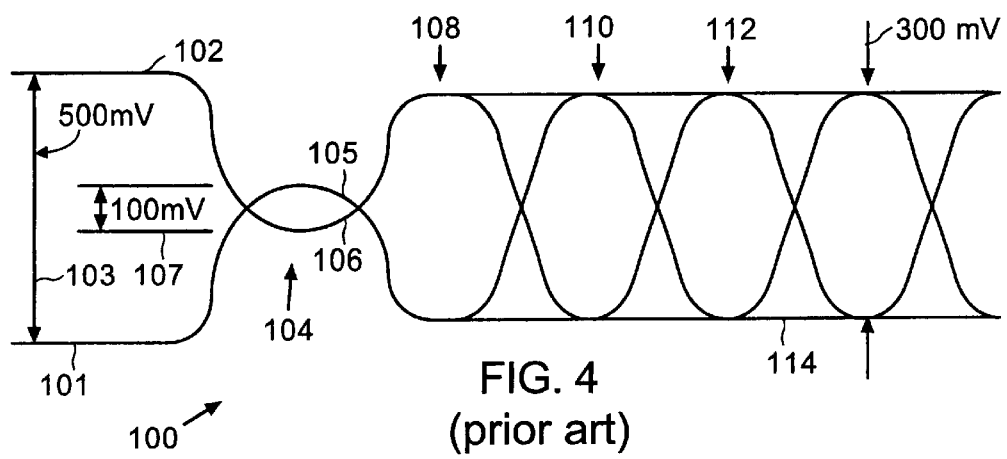
FIG. 4 shows a series of pulses for a bus line in which the first pulse problem is present.
Figure 5:
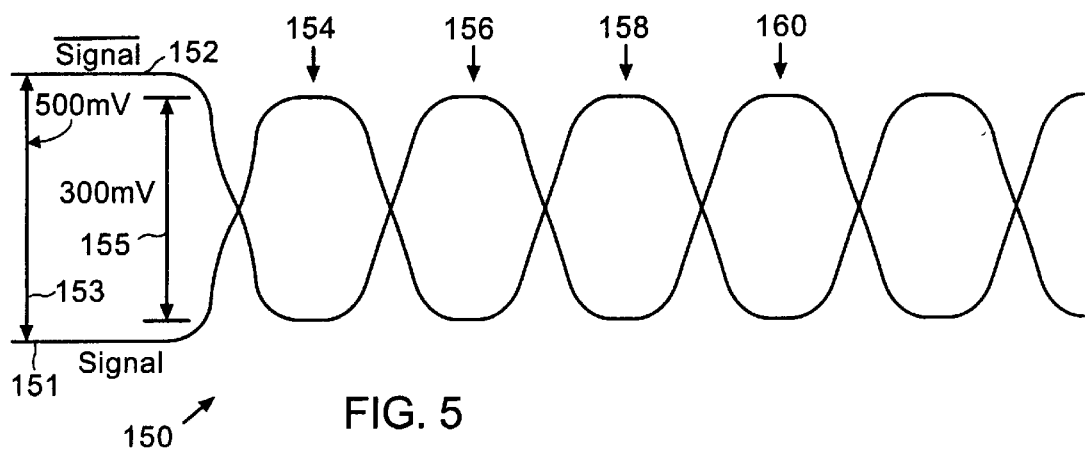
FIG. 5 shows a series of pulses for a bus line in which an embodiment of the present invention is used.

In one embodiment of the present invention, an improved driver provides a series of pulses 150 such as shown in FIG. 5. An apparatus for achieving these pulses will be described in greater detail below with reference to FIGS. 7, 8, and 9. Signal 151 and its complement signal/ 152 represent the changing state of information being transmitted over one line of an SCSI bus. As shown in FIG. 5, signals 151 and 152 have a 500 mV differential 153 in their steady state. When first pulse 154 occurs, it is able to maintain a 300 mV differential 155 between the peaks of signal 151 and signal/ 152. Thus, no first pulse problem is present in this embodiment of the invention, and information may be transmitted accurately during the first pulse of a signal. Subsequently, pulses 156, 158, 160, etc., also maintain a 300 mV differential between their peaks.

In this embodiment, the extra power needed to remedy the quality of first pulse 154 is only supplied for the duration of the first pulse so that the output driver strength is minimized and the total power over time that an integrated circuit must dissipate is reduced. In one embodiment, the improved multi-strength driver of the present invention turns on only for the first pulse after a steady state time of approximately four bus cycles. This technique saves power because the extra drive strength is not on for all of the signal pulses. In a further embodiment, instead of the power level returning to normal after a first pulse, a smaller amount of increased drive strength may be turned on only for the second pulse and a further reduced drive strength could be turned on for the third pulse, etc. In this fashion, minor reductions in quality for the second, third and subsequent pulses could also be remedied by using a multi-strength driver that produces extra strength at pulse one, and also produces decreasing levels of extra power for subsequent pulses until such time as a subsequent pulse does not need any extra strength, in which case the output drive strength returns to a normal power level.

Figure 6:
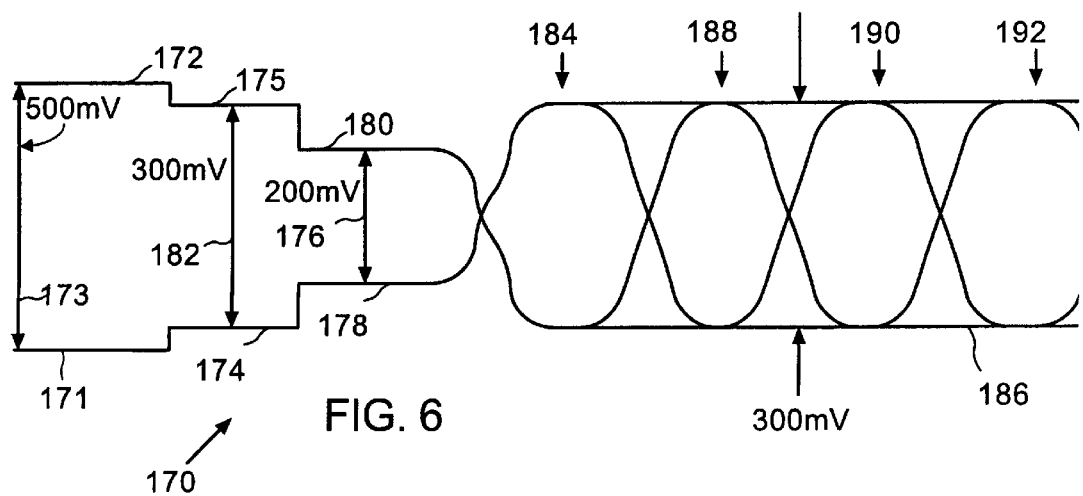
FIG. 6 shows a series of pulses for a bus line in which another embodiment of the present invention is used.

FIG. 6 illustrates pulses 170 that present another embodiment of the present invention. In this embodiment, the output driver is designed such that its output drive strength is decreased in power while an output remains in a particular state. In other words, the longer the output remains at the same state, the less output drive current is supplied to that output. When the output does finally switch states, it switches at normal strength, meaning that the net effect is an increased drive strength from the steady state to the new state. FIG. 6 shows a signal 171 and its complement signal/ 172 being separated by a differential of 500 mV 173. An apparatus for implementing the embodiment of FIG. 6 will be discussed in greater detail below with reference to FIGS. 10 and 11.

In this first bus cycle of FIG. 6, signals 171 and 172 are maintained at a differential of 500 mV. As these signals remain in the states for a number of bus cycles, the output drive power is reduced gradually in steps until the output finally changes state. A gradual reduction in steps is used to eliminate excess noise generated when output power is reduced all at once instead of gradually. Once the output changes state, normal power will be supplied at the first pulse, resulting in a net increase in power and elimination of the first pulse problem.

Thus, after the first bus cycle, power is reduced to the output driver such that signal 171 has a power level 174 and signal 172 has a power level 175 that are separated by only a 300 mV differential 176. After the second bus cycle, the output power is further decreased such that signal 171 has a power level 178 and signal 172 has a power level 180 resulting in only a 200 mV differential 182 between the two signals. At this point, because the output drive power has been reduced, when a normal output drive current is then produced at the first pulse the net result is that there has been an increase in the amount of power from the steady state condition to the first pulse.

Thus, first pulse 184 is generated as shown having a voltage differential between its two peaks of 300 mV 186. Likewise, subsequent pulses 188, 190 and 192 each have voltage differentials of 300 mV as well. Of course, power levels may be decreased in any number of steps, and may be decreased in steps of any size. Also, power may be decreased after any number of clock cycles, and power reduction may occur over any number of cycles.

Figure 7:
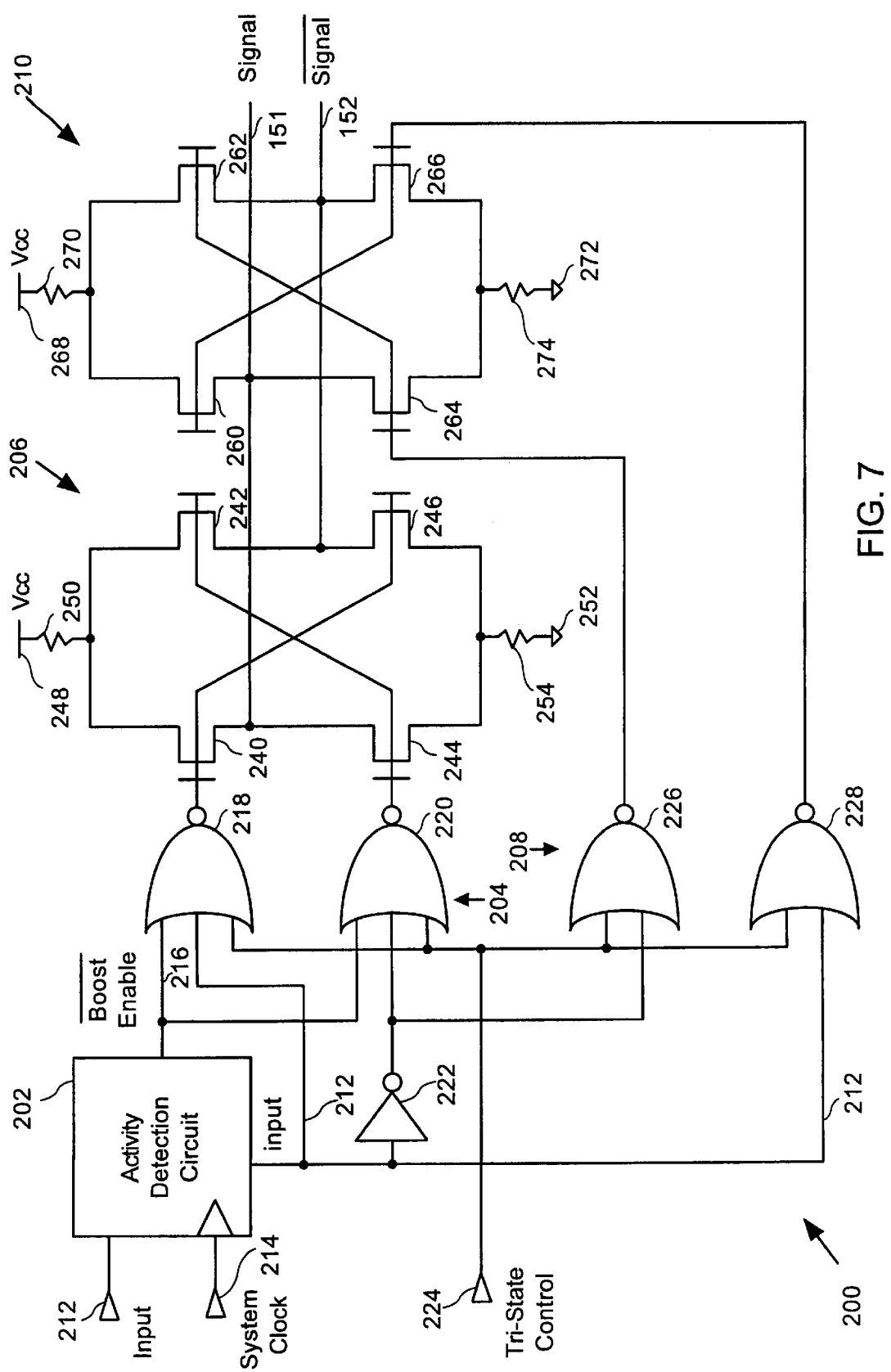
FIG. 7 illustrates a driver circuit for a bus line using a power boost driver according to one embodiment of the present invention.

FIG. 7 illustrates one possible embodiment of a driver circuit 200 for producing signals 151 and 152 as shown in FIG. 5. This driver circuit uses a boosting differential driver in order to remedy the first pulse problem. Driver circuit 200 includes activity detection circuit 202, control logic 204 for boosting differential driver 206 and control logic 208 for differential driver 210. The input to driver circuit 200 includes an input value 212 representing a data bus line, an ACK line, REQ line or other similar control line, and a system clock 214.

Figure 8:
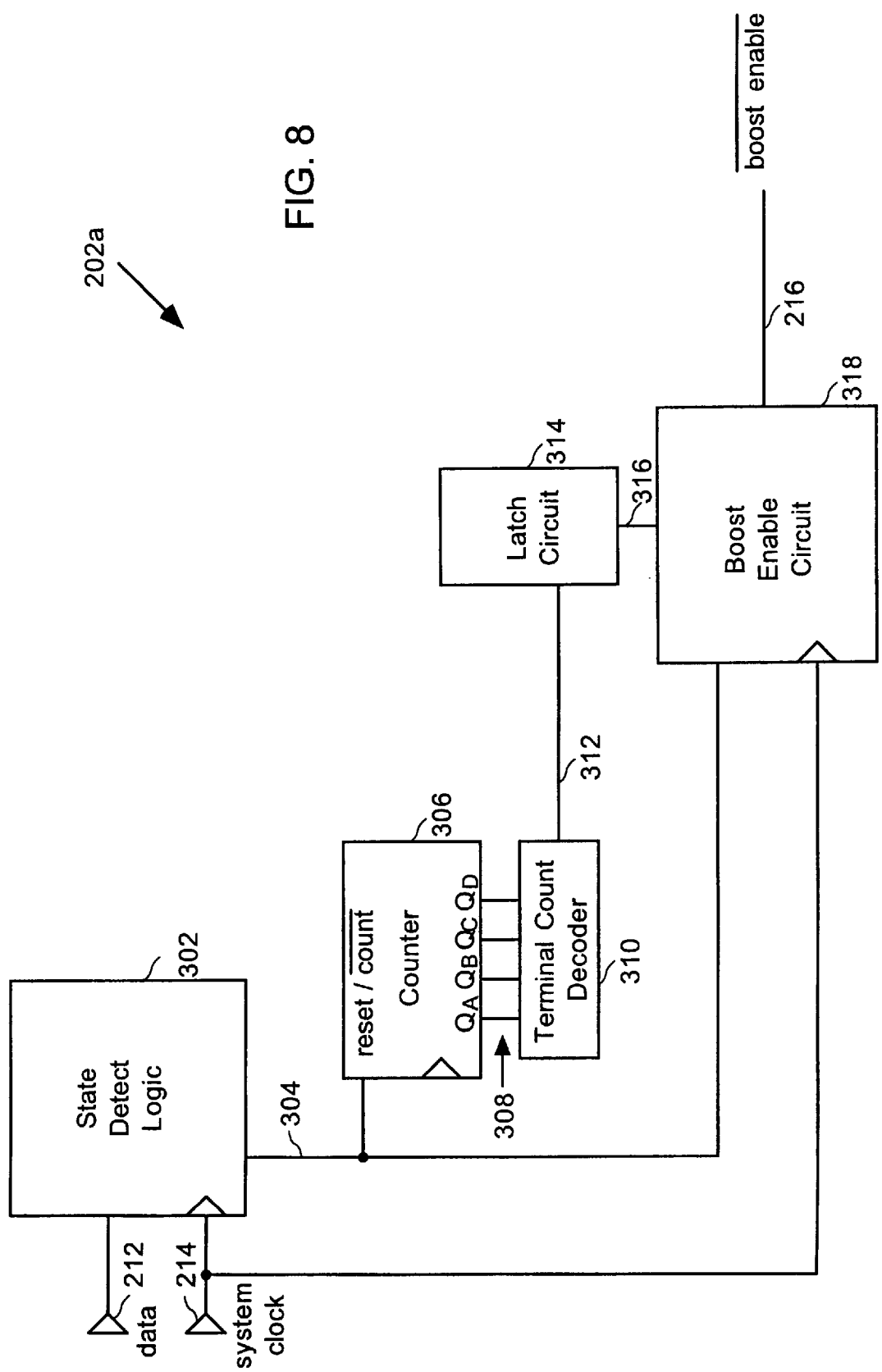
FIG. 8 illustrates one embodiment of the activity detection circuit of FIG. 7 for use with an input data line.
Figure 9:
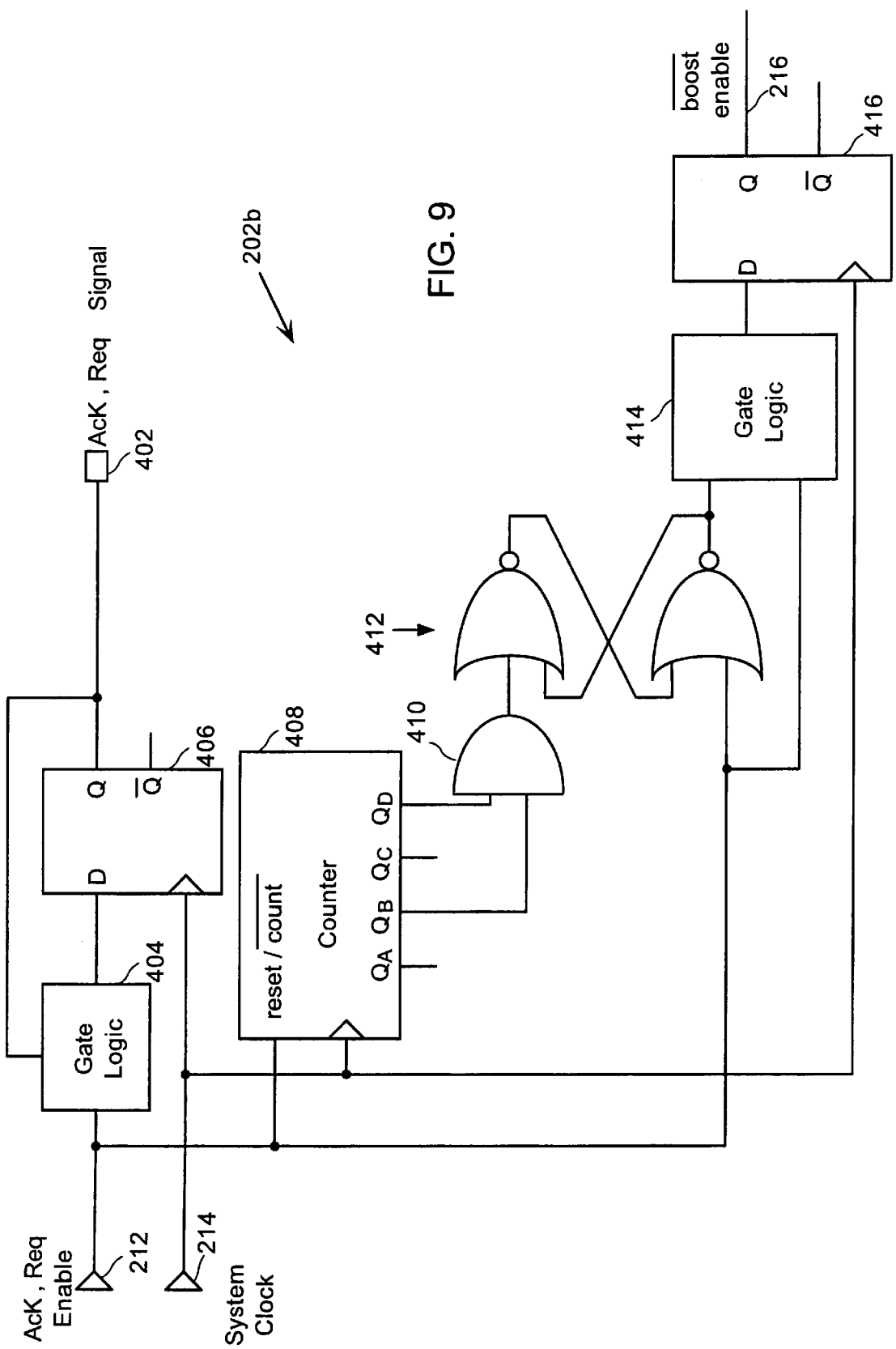
FIG. 9 illustrates another embodiment of the activity detection circuit of FIG. 7 for use with an input clock line.

Activity detection circuit 202 monitors the state of input line 212, and when the state has not changed for a specified number of clocks (such as four clock periods), then the circuit turns on a boost enable signal 216 that is used to supply extra power to the output drive signals 151 and 152 for the first pulse after the steady state condition. Embodiments of activity detection circuit 202 are shown in FIGS. 8 and 9.

Control logic 204 includes gate 218 and gate 220. Boost enable signal 216 is combined with input signal 212 in gate 218, and is combined with an inverted input signal using inverter 222 in gate 220. A tri-state control signal 224 is also input to each of gates 218 and 220 for controlling when output bits are sent to boosting differential driver 206. Tri-state control 224 is used to disable output from driver circuit 200 when no signal is being sent (i.e., removing the driver from the bus). Additional control logic 208 includes gate 226 and gate 228 that respectively combine the tri-state control signal with the input signal and an inverted input signal in order to control differential driver 210.

Boosting differential driver 206 is used to provide additional current for a signal to be driven when the signal changes states after a period of inactivity. Driver 206 includes cross-coupled NMOS transistors 240, 242, 244, and 246. A voltage V(cc) 248 is supplied to the cross-coupled transistors via resistor 250. Likewise, ground 252 is connected to the cross-coupled transistors as shown via resistor 254. It should be appreciated that a wide variety of supply voltages and resistors may be suitable for use with the present invention. By way of example, a supply voltage of 2.5 volts works well with resistors 250 and 254 having values of 260 ohms. In an alternative embodiment, the voltage source, ground, and the resistors may be replaced by current sources of approximately 4 mA, although a voltage source is preferred.

Differential driver 210 provides normal current for a signal to be driven during a steady state, or after a first pulse when extra current is not needed. Driver 210 includes cross-coupled NMOS transistors 260, 262, 264, and 266. A voltage V(cc) 268 is supplied to the cross-coupled transistors via resistor 270. Likewise, ground 272 is connected to the cross-coupled transistors as shown via resistor 274. It should be appreciated that a wide variety of supply voltages and resistors may be suitable for use with the present invention. By way of example, voltage, resistors and an alternative current source may be as specified above for boosting differential driver 206.

In operation, driver circuit 200 operates as follows. When a particular input signal 212 has remained in a particular state for a specified number of clock cycles, activity detection circuit 202 will turn on boost enable signal 216. As long as tri-state control 224 is not asserted, gates 218 and 220 will then pass the appropriate signal to boosting differential driver 206 in order to produce additional power for signals 151 and 152. For example, if signal 151 has remained in a low state for a specified period of time, and then switches to a high state for a first pulse, then gate 218 will turn on transistors 240 and 246 in order to produce an extra boost for a high state for signal 151 and a low state for signal/ 152. As will be appreciated by those skilled in the art, differential driver 210 continues to operate in its normal fashion providing a normal level of power for signals 151 and 152 which are augmented by boosting differential driver 206. In this fashion, an extra boost of power is provided for one first pulse for an input signal in order to remedy the first pulse problem. Of course, driver 200 may also provide additional power for subsequent pulses if activity detection circuit asserts boost enable signal 216 for subsequent pulses detected to need additional power.

Activity detection circuit 202 may be implemented in a wide variety of fashions. By way of example, in order to detect activity or lack thereof on a data line, activity detection circuit 202 may be implemented as circuit 202a illustrated in FIG. 8.

FIG. 8 illustrates one embodiment of activity detection circuit 202 of FIG. 7, and may be used to detect activity of a data bus line. Inputs to circuit 202a are a data line 212 and a system clock 214 which combine to produce a boost enable output 216 when data line 212 has remained in a particular state for a specified number of clock cycles and then switches. Such an activity detection circuit may be implemented in a variety of manners. By way of example, circuit 202a illustrates one possible circuit by which a boost enable output may be developed from a data bus line or the like.

Circuit 202a includes state detect logic 302 having an output 304, a counter 306 having a number of outputs 308, and a terminal count decoder 310 having an output 312. Latch circuit 314 has an output 316, and a boost enable circuit 318 produces boost enable output 216. State detect logic 302 uses a combination of flip-flops and gates in order to determine when data line 212 has remained in a particular state over a number of clock cycles, or when it changes state. When data line 212 remains in one state, output 304 produces a low value to enable counter 306 to count the number of clock cycles that data line 212 remains in one state. When data line 212 changes state, then output 304 has a high value which resets counter 306. Thus, counter 306 only counts the number of clock cycles that data line 212 remains in one state.

The output 308 from counter 306 is fed into a terminal count decoder 310 which is designed to decode any count values from counter 306. In this way, when data line 212 remains in a steady state for a predetermined number of clock cycles, terminal count decoder 310 outputs a signal 312 to latch circuit 314. Latch circuit 314 retains a value indicating that data line 212 has remained in one state for a number of clock cycles; thus, an extra boost of power will be needed the next time data line 212 changes state. This value is passed from latch circuit 314 by output 316 to boost enable circuit 318. Boost enable circuit 318 has a system clock input and also accepts as input output signal 304 from state detect logic 302. Thus, when output 304 indicates that data line 212 has changed states, boost enable circuit 318 determines whether output 316 indicates that an extra boost of power is needed. If extra power is needed when data line 212 changes state (indicating a potential first pulse problem), then boost enable circuit 318 asserts a low boost enable output 216 to enable driver 206 of FIG. 7 to supply extra power for signals 151 and 152. Thus, in this fashion extra power is delivered for a first pulse for a data line after it has remained in one state for a number of clock cycles.

Activity detection circuit 202 may also be implemented in other fashions to detect activity upon a wide variety of other types of bus lines. In an alternative embodiment of the invention, circuit 202 may be implemented as shown in circuit 202b of FIG. 9 in order to detect activity on clock signal lines of a bus, such as on ACK or REQ lines. Lines such as these transmit a hand shaking clock signal used when data is passed along the bus. In this embodiment, an ACK or REQ enable signal 212 along with system clock 214 is input to activity detection circuit 202b in order to produce a boost enable signal 216, as well as the actual ACK or REQ clock signal 402. Of course, a wide variety of logic circuits may be used to monitor the activity of the ACK and REQ enable signals in order to produce a boost enable signal 216. By way of example, FIG. 9 illustrates one particular implementation.

In this example, activity detection circuit 202b includes gate logic 404, flip-flop 406, a counter 408, terminal count detection logic 410, a latch 412, gate logic 414, and flip-flop 416. ACK or REQ enable signal 212 indicates when these signals are to run. In other words, ACK or REQ enable signal 212 is a system control signal that when asserted allows the ACK or REQ signal 402 to run. When enable signal 212 is not asserted, then ACK or REQ signal 402 is not being clocked and remains in a steady state. Thus, the switching of enable signal 212 is useful for determining when ACK or REQ signal 402 is running, for how many clock cycles it remains idle, and for determining when the signal begins to run again, which is when a first pulse boost is needed. In one embodiment of a bus, ACK or REQ signal 402 is generated by dividing the system clock by two. Thus, for a desired speed of, for example, 40 MHz, system clock 214 runs at 80 MHz.

Gate logic 404 contains gate circuitry to allow flip-flop 406 to divide system clock signal 214 by two, in order to produce an ACK or REQ signal 402. In other words, similar to the activity detection circuit in FIG. 8, in which a data line 212 is monitored in order to determine when a boost enable signal should be given, ACK or REQ enable signal 212 is monitored in order to determine when the ACK or REQ signal has been idle for a number of clock periods and thus a first pulse boost is needed. Flip-flop 406 is clocked by system clock 214 and accepts as input D an output from gate logic 404 in order to produce an output Q. Output Q is ACK or REQ signal 402 that is clocking whenever ACK or REQ enable signal 212 is active.

Counter 408 is used to detect a terminal count indicating for how many clock periods the ACK or REQ signal has been idle indicating that a first pulse boost is needed. For example, if it is determined that a first pulse boost is needed for an ACK or REQ signal after it has remained idle for five clock periods, then counter 408 will count the number of idle clock periods and if a value of "5" is reached, its outputs will be used to produce a boost enable signal. When enable signal 212 is active, counter 408 is in a reset mode and is not counting idle clock periods. However, when enable signal 212 is not active, then counter 408 begins counting the number of clock periods that an ACK or REQ signal is not being produced. When a predetermined count has been reached, terminal count detection circuitry 410 sets latch 412.

Terminal count detection circuit 410 may be implemented in a wide variety of manners. By way of example, in this embodiment circuit 410 includes an AND gate that detects when counter 408 has reached the value of "5". A value of "5" is detected when outputs Q(B) and Q(D) each have a value of "1". It should be appreciated that circuit 410 may take a variety of forms in order to detect a particular count from the outputs of counter 408.

Thus, when a terminal count is reached and detected, latch 412 sets a bit indicating that ACK or REQ signal 402 has been idle long enough such that an extra boost of power will be needed when the ACK or REQ signal begins again. Thus, the next time that enable signal 212 becomes active, it is combined with the output of latch 412 in gate logic 414 in order to enable flip-flop 416. On the next system clock pulse, flip-flop 416 outputs a value Q that is a boost enable signal 216 that may be used such as shown in FIG. 7 in order to provide more power to a first pulse of an ACK or REQ signal. Gate logic 414 is a number of logic gates that may be implemented in variety of fashions as will be appreciated by one of skill in the art to achieve its desired function.

Figure 10:
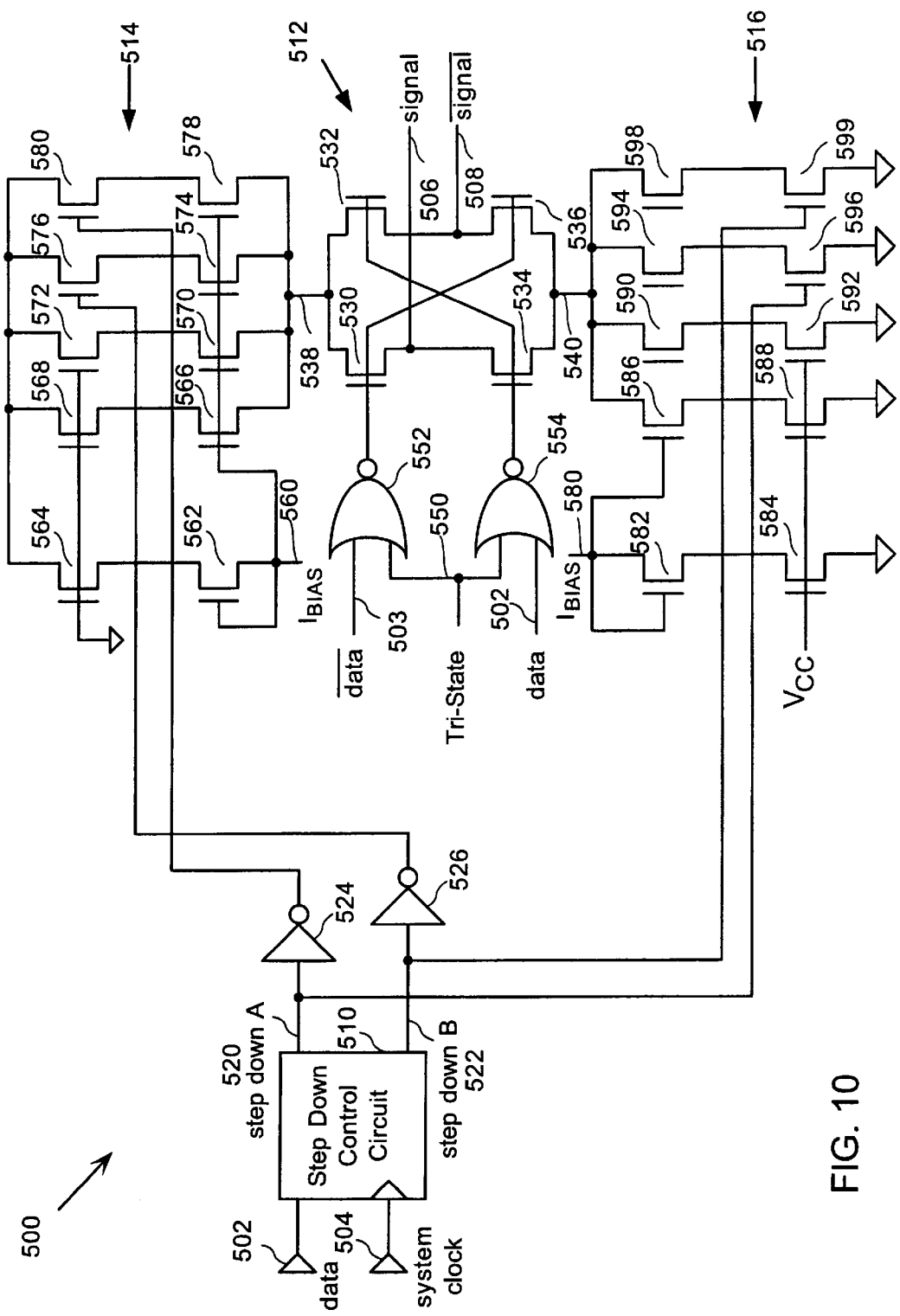
FIG. 10 illustrates a driver circuit for a bus line having step down power reduction circuitry according to one embodiment of the present invention.

FIG. 10 illustrates an embodiment of circuitry 500 that may be used to gradually step down power to signals of a bus line in order to achieve signal wave forms such as are shown in FIG. 6, for example. Such circuitry is useful in remedying the first pulse problem. Circuitry 500 inputs a data signal 502 and a system clock 504 and produces signals 506 and 508 that are used to transmit information along a bus line. Circuitry 500 includes a step down control circuit 510, a differential driver 512, a current source 514 and a current source 516. In one embodiment of the invention, the transistors of current source 514 are p-channel transistors and those of current source 516 are n-channel transistors. Of course, if the logic were to be reversed for the control signals, the types of transistors may be switched.

Figure 11:
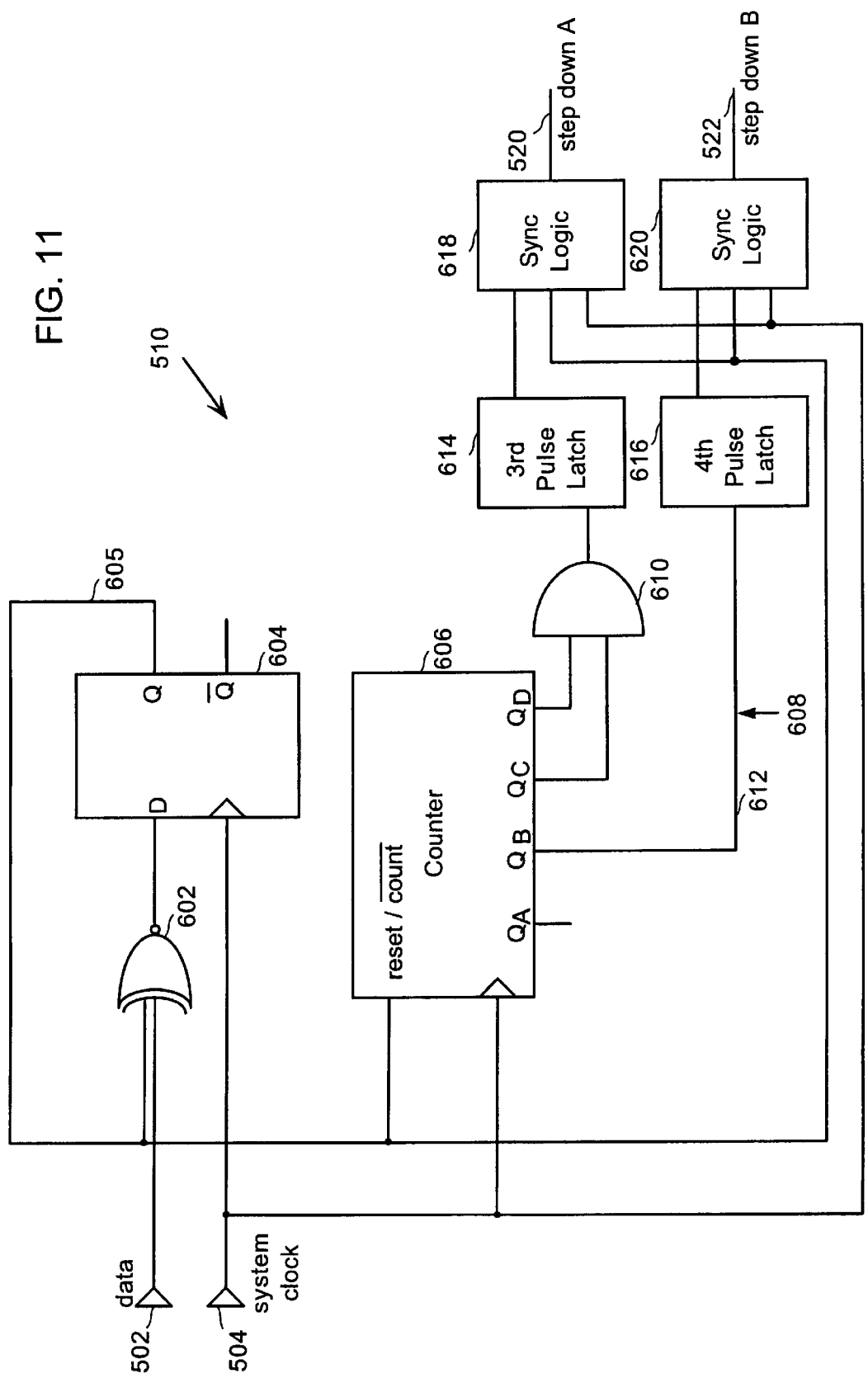
FIG. 11 illustrates an embodiment of the step down control circuit of FIG. 10.

Step down control circuit 510 may be implemented in a wide variety of manners. By way of example, circuit 510 may be implemented as illustrated in FIG. 11. Circuit 510 is used to monitor data line 502 and to determine when it is appropriate to step down a portion of the power to the signal driving that data line. In this embodiment of the invention as illustrated in FIG. 10, circuit 510 outputs a step down signal A 520 and a step down signal B 522. When asserted low, signal 520 steps down power by twenty-five percent, and signal 522 steps down power by another twenty-five percent for a total of one-half reduction in power. It should be appreciated that power may be stepped down in any size increments and in a multitude of steps. When signal 520 is asserted, this signal is passed to current source 516 and its inverted value is passed to current source 514 via inverter 524 in order to turn off twenty-five percent of the power to differential driver 512. In a similar fashion, when signal 522 is asserted, the signal is passed to current source 516 and its inverted value is passed to current source 514 via inverter 526 in order to further reduce power to differential driver 512 by another twenty-five percent. In this fashion, power to the driver is reduced gradually in steps in order to avoid excess noise.

Differential driver 512 provides normal current for a signal to be driven during and after a first pulse, and also provides normal current before power reduction occurs in a steady state. Driver 512 includes cross-coupled NMOS transistors 530, 532, 534, and 536. Driver 512 provides signals 506 and 508 as shown. Driver 512 receives a current through point 538 from current source 514. Likewise, current source 516 supplies a current through point 540 to the differential driver. Data signal 502 and its inverse data/ 503, are combined with a tri-state controlling signal 550 using gates 552 and 554 respectively, in order to provide driving data for differential driver 512.

Current source 514 includes a supply current I(BIAS) 560 connected to transistors 562 and 564. Current source 514 has four legs each of which supplies one fourth of the total current to driver 512 through point 538. The first leg includes transistors 566 and 568. The second leg includes transistors 570 and 572, and the third and fourth legs include transistors 574, 576, 578, and 580, respectively. Supply current 560 maintains transistors 566, 570, 574 and 578 in an "ON" state while transistors 564, 568, and 572 are connected to ground to maintain them in an "ON" state. Transistor 576 is maintained in an "ON" state unless step down signal B 522 is asserted low. Similarly, transistor 580 is maintained in an "ON" state, unless step down signal A 520 is asserted low. In this fashion, step down signals 520 and 522 may each be used to turn off one leg of current source 514, thus reducing power to driver 512 by twenty-five percent for each turned off leg.

Current source 516 may be implemented in a similar fashion as current source 514. By way of example, current source 516 includes a supply current I(BIAS) 580 connected to transistors 582 and 584. Current source 516 has four legs each of which supplies one fourth of the total current to driver 512 through point 540. The first leg includes transistors 586 and 588. The second leg includes transistors 590 and 592, and the third and fourth legs include transistors 594, 596, 598, and 599, respectively. Supply current 580 maintains transistors 586, 590, 594 and 598 in an "ON" state while transistors 584, 588, and 592 are connected to V(cc) to maintain them in an "ON" state. Transistor 596 is maintained in an "ON" state unless step down signal A 520 is asserted low. Similarly, transistor 599 is maintained in an "ON" state, unless step down signal B 522 is asserted low. In this fashion, step down signals 520 and 522 may each be used to turn off one leg of current source 516, thus reducing power to driver 512 by twenty-five percent for each turned off leg.

In one embodiment of the invention, a current of 7 mA from each of current sources 514 and 516 is supplied passing through each of points 538 and 540 to differential driver 512. Thus, a value of 1.75 mA for supply current 560 and for supply current 580 may be used in this embodiment of the invention.

FIG. 11 illustrates one embodiment of step down control circuit 510 of FIG. 10. Of course, circuit 510 may be implemented in a variety of fashions to achieve the desired functionality. Circuit 510 uses inputs data 502 and system clock 504 in order to produce a step down signal A 520 and a step down signal B 522. Circuit 510 includes gate 602, a flip-flop 604, a counter 606 and counter decoding logic 608. In this example, logic 608 is simply a gate 610 (for decoding a count of "3"), and a direct line 612 (for decoding a count of "4"). Circuit 510 also includes a third pulse latch 614, a fourth pulse latch 616, synchronization logic 618 and synchronization logic 620.

Step down control circuit 510 is used to reduce power gradually to a pair of signal lines that represent a bus line when that bus line remains in a particular state for a specified number of clock cycles. In an alternative embodiment, if a bus line such as data 502 is run through a pipeline, then "look forward" circuitry may be used to reduce power for a given number of clock cycles. For example, if it is known ahead of time that a data line will have a steady value for four clock cycles, then power may be reduced gradually for each of these four cycles and then returned to normal power on the fifth cycle when the data line changes. Thus, this increase in power to a normal level on the fifth cycle remedies the first pulse problem for this line.

Circuit 510 may reduce power in any number of increments, in which case there may be more than the two output lines 520 and 522. In this particular embodiment, gate 602 is used in conjunction with flip-flop 604 in order to provide an output signal Q 605 that indicates when data is unchanging for a number of cycles or when it changes after a period of steady state. When data 502 remains in a steady state over a number of clock cycles, then output 605 has a low value and counter 606 is able to count the number of clock cycles that data 502 remains in one state. When data 502 finally changes states, then output 605 has a high value and counter 606 is reset.

In this example, counter 606 enables step down power reductions for a third pulse and a fourth pulse of the system clock while data 502 remains in one state. Thus, gate 610 decodes a count of "3" which is stored in third pulse latch 614. In a similar fashion, line 612 decodes a count of "4" which is stored in fourth pulse latch 616. The output from latches 614 and 616 is combined with output 605 and with the system clock in synchronization logic 618 and 620. The logic in blocks 618 and 620 synchronizes the timing of the input signals, and delivers a low value on either of lines 520 or 522 on a system clock pulse when its associated latch indicates a count has been reached, and when output 605 indicates that data 502 has continued to remain in a steady state. Output 605 also indicates when data 502 changes state, thus, output 605 can be used by logic 618 or logic 620 in order to disable any step down power reduction and to deliver full normal power to the differential driver 512 of FIG. 10. Thus, when full normal power is delivered to a signal line after power has been reduced on that line, the first pulse of that signal line will be of a sufficient amplitude to remedy the first pulse problem.

Although the foregoing invention has been described in some detail for purposes of clarity of understanding, it will be apparent that certain changes and modifications may be practiced within the scope of the appended claims. For instance, it should be appreciated that the present invention is applicable to other interface standards aside from SCSI in which a first pulse problem is present. Also, the improved driver may be used in a computer, peripheral or other device, and may be embodied in an integrated circuit or in discrete logic. Furthermore, the improved driver may be used to drive any appropriate signal of a bus that experiences the first pulse problem, and is not limited to the data and control lines discussed herein. Additionally, power may be reduced or increased during a steady state condition for a signal, as long as the power is then increased for the first pulse relative to the steady state power. The activity detection circuitry and the step down control circuitry shown are examples of control circuitry and other similar circuits having similar functionality may also be used. Also, the stepping down of power may occur in many increments of a variety of sizes and over any number of clock cycles. Furthermore, the switching transistors shown in the driver circuits and in the current sources are exemplary, and other equivalent devices may also be used. Therefore, the described embodiments should be taken as illustrative and not restrictive, and the invention should not be limited to the details given herein but should be defined by the following claims and their full scope of equivalents.

I claim:

1. A low-voltage differential driver for use in transmitting an output value on a bus line of a computer system having a system clock, said driver comprising:
   a step down control circuit including logic circuitry that determines a state of said output value and enabling circuitry that produces a power reduce signal while said output value remains in a steady state and before a first pulse of said output value is to be transmitted;
   a differential driver circuit arranged to deliver varying levels of power to a pair of differential signals used for transmitting said output value over said bus line of said computer system;
   a first current source circuit that is arranged to supply varying levels of current to said differential driver circuit; and
   a second current source circuit that is arranged to supply varying levels of current to said differential driver circuit, said first current source circuit and said second current source circuit being arranged to receive said power reduce signal and to reduce a level of current supplied to said differential driver circuit when said power reduce signal is active, and being further arranged to deliver a normal level of current when said power reduce signal is not active, whereby said first pulse of said output value receives a greater power level than a power level delivered to said output value before said first pulse.

2. A low-voltage differential driver as recited in claim 1 wherein said bus line is part of a small computer system interface (SCSI) bus that is terminated with no bias voltage, and wherein said differential driver circuit supplies power to drive said pair of differential signals over said SCSI bus.

3. A low-voltage differential driver as recited in claim 1 wherein said differential driver circuit supplies said greater power level for only a first pulse of said output value after said output value has remained in one state for a specified number of system clock cycles, whereby said first pulse is of a sufficient amplitude to be accurately detected by a receiver of said computer system and whereby power of said driver is conserved.

4. A low-voltage differential driver as recited in claim 1 wherein said logic circuitry of said step down control circuit is arranged to detect a state of a data output value, and said enabling circuitry of said step down control circuit produces said power reduce signal upon reaching a specified count of a number of system clock cycles during which said state of said data output value has remained constant, whereby said first pulse of said data output value is increased in amplitude.

5. A low-voltage differential driver as recited in claim 4 wherein said enabling circuitry of said step down control circuit produces a plurality of power reduce signals, each of said power reduce signals being produced upon reaching a distinct specified count of a number of system clock cycles during which said state of said data output value has remained constant, and wherein said first current source circuit and said second current source circuit being further arranged to receive said power reduce signals and to incrementally reduce a level of current supplied to said differential driver circuit upon receipt of each of said power reduce signals.

6. An integrated circuit including the driver as recited in claim 1.

7. A method of transmitting an output value on a bus line of a computer system having a system clock using a low-voltage differential driver, said method comprising the steps of:
   determining whether said output value has remained in a constant state for a specified number of system clock cycles;
   producing a power reduce signal when it is determined that said output value has remained in said constant state for a specified number of system clock cycles and before a first pulse of said output value is to be transmitted;
   reducing a level of current supplied to a differential driver circuit used for transmitting said output value over said bus line of said computer system, such that said output value is transmitted in said constant state at a reduced power level;
   determining whether said output value has changed state;
   disabling said power reduce signal when it is determined that said output value has changed state; and
   supplying a normal level of current to said differential driver circuit, whereby said first pulse of said output value receives a greater power level than said reduced power level delivered to said output value before said first pulse.

8. A method as recited in claim 7 wherein said bus line is part of a small computer system interface (SCSI) bus that is terminated with no bias voltage, and wherein said reduced power level and said greater power level drive a pair of differential signals over said SCSI bus.

9. A method as recited in claim 7 wherein said step of supplying a normal level of current supplies said greater power level for only a first pulse of said output value after said output value has remained in said constant state for a specified number of system clock cycles, whereby said first pulse is of a sufficient amplitude to be accurately detected by a receiver of said computer system and whereby power of said driver is conserved.

10. A method as recited in claim 7 wherein said step of producing a power reduce signal includes the sub-step of producing a plurality of power reduce signals, each of said power reduce signals being produced upon reaching a distinct specified count of a number of system clock cycles during which said state of said output value has remained constant, and wherein said step of reducing a level of current includes the sub-step of receiving said power reduce signals and incrementally reducing a level of current supplied to said differential driver circuit upon receipt of each of said power reduce signals.

* * * * *